United States Patent
Yu

(10) Patent No.: US 9,690,208 B2
(45) Date of Patent: Jun. 27, 2017

(54) MIRROR ARRAY IN DIGITAL PATTERN GENERATOR (DPG)

(71) Applicant: TAIWAN SEMICONDUCTOR MANUFACTURING COMPANY, LTD., Hsin-Chu (TW)

(72) Inventor: Tsung-Hsin Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 415 days.

(21) Appl. No.: 14/102,309

(22) Filed: Dec. 10, 2013

(65) Prior Publication Data

US 2015/0160568 A1 Jun. 11, 2015

(51) Int. Cl.
*G03F 7/20* (2006.01)
*H01J 37/317* (2006.01)
*H01J 37/302* (2006.01)

(52) U.S. Cl.
CPC ...... *G03F 7/70491* (2013.01); *H01J 37/3023* (2013.01); *H01J 37/3175* (2013.01); *H01J 2237/30405* (2013.01); *H01J 2237/31789* (2013.01)

(58) Field of Classification Search
CPC .......................... G03F 7/70491–7/70541; H01J 37/3023–37/3026
USPC ..................................... 355/67; 250/306–311
See application file for complete search history.

(56) References Cited

U.S. PATENT DOCUMENTS

| | | | |
|---|---|---|---|
| 5,838,119 A | 11/1998 | Engle et al. | |
| 6,379,867 B1 | 4/2002 | Mei et al. | |
| 7,141,340 B2 | 11/2006 | Bleeker et al. | |
| 7,330,239 B2 | 2/2008 | Baselmans et al. | |
| 8,835,929 B2 | 9/2014 | Xi et al. | |
| 8,975,601 B1 * | 3/2015 | Chen .................. | H01J 37/3175 250/396 R |

FOREIGN PATENT DOCUMENTS

| | | |
|---|---|---|
| JP | 2006295175 A | 10/2006 |
| KR | 10-20090116118 | 11/2009 |
| WO | WO 2009136725 A2 | 12/2009 |

* cited by examiner

*Primary Examiner* — Steven H Whitesell Gordon
*Assistant Examiner* — Jerry Brooks
(74) *Attorney, Agent, or Firm* — Haynes and Boone, LLP

(57) ABSTRACT

Systems and method directed to digital pattern generator (DPG) having a mirror array in an e-beam lithography system are discussed. The mirror array includes a first bank of mirrors and a second bank of mirrors with a combination logic structure interposing the first and second banks of mirrors. An output data line extends from the first bank of mirrors to the combinational logic structure. An input data line that carries data associated with the second bank of mirrors is also provided to the combinational logic structure. An output data line extends from the combinational logic structure to second data bank.

20 Claims, 5 Drawing Sheets

MIRROR ARRAY IN DIGITAL PATTERN GENERATOR (DPG)

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into smaller technology process nodes in pursuit of higher device density, higher performance, and lower costs, stricter demands have been placed on lithography process. Numerous techniques such as immersion lithography, multiple patterning, extreme ultraviolet (EUV) lithography have been utilized to support critical dimension (CD) requirements of the smaller devices. Another of the promising lithography technique is the use of electron beam writer systems operable to perform mask-less lithography processes. An e-beam system may use complementary-metal-oxide-semiconductor (CMOS) device or devices with an array of controllable pixels, which can act as an array of electron mirrors. Using this device, the system can generate a pattern to be written on a target substrate by reflecting an electron beam off the array of mirrors where the pixels of the array are turned off or on. It is required, or at least desired, that the operation of the mirror array be verified to ensure acceptable quality levels of the written data. In particular as mirror arrays increase in size, this verification can be consuming in most cost and time resources. Accordingly, although existing lithography methods have been generally adequate, they have not been satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
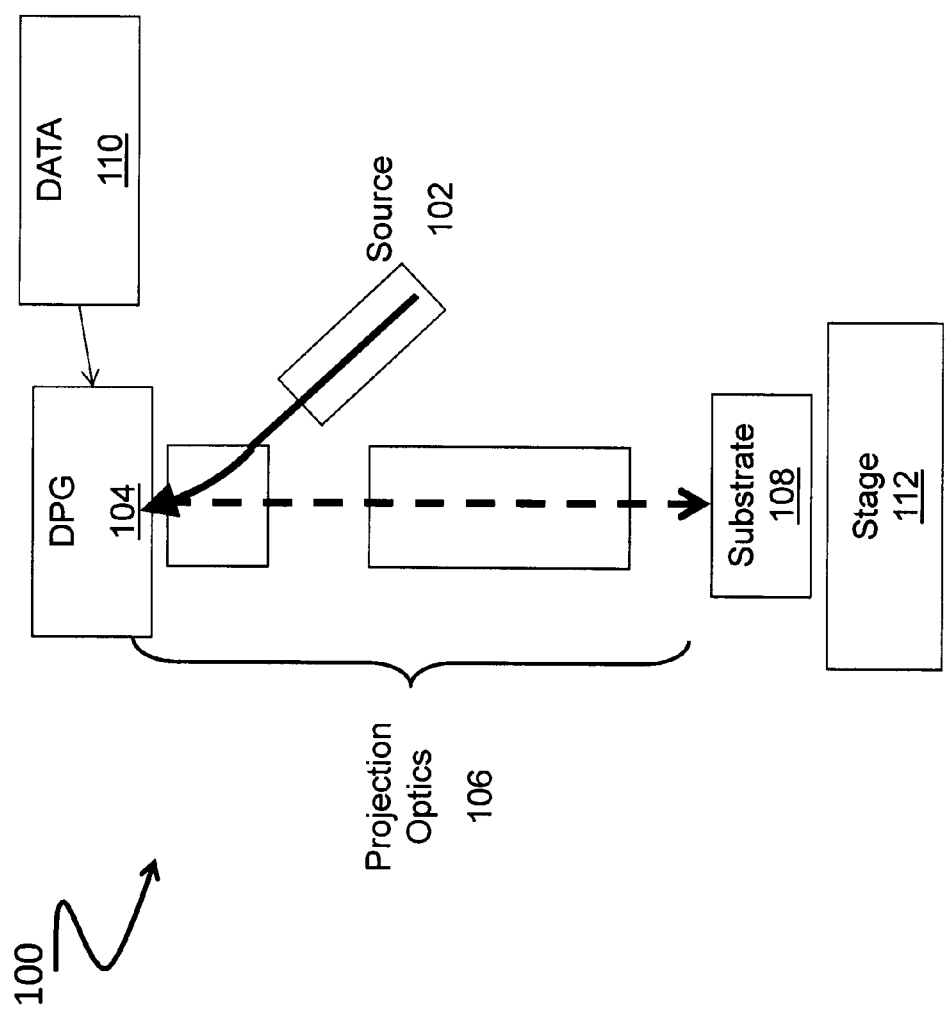
FIG. 1 is an embodiment of a system of lithography according to one or more aspects of the present disclosure.

Illustrated in FIG. 1 is an embodiment of an electron beam lithography system 100. The e-beam system 100 provides for a beam of electrons being incident a target surface in a patterned manner. The target surface is typically covered with a photosensitive material also referred to as a resist. The patterned resist is then developed to selectively remove either the exposed or non-exposed regions of the resist. This forms masking elements of the resist which are used to pattern underlying layers, typically by suitable etching processes such as dry etch, plasma etch, and/or wet etch.

The lithography system 100 includes an electron beam source (also referred to as an electron gun) 102, a digital pattern generator (DPG) 104, a projection optics system 106, and a target substrate 108. The target substrate 108 is placed on a wafer stage 112. Data 110 is provided to the DPG 104. The arrangement of components in the system 100 is exemplary only and not intended to be limiting. Furthermore, additional components may be added and/or components omitted. The solid lines illustrate the illuminating beam from the electron gun 102 to the DPG 104. The dashed lines illustrate the modulated (patterned) reflective beam from the DPG 104 to the substrate 108.

The target substrate 108 may be a semiconductor substrate such as a wafer. In an embodiment, the substrate 108 is silicon. Alternatively, the substrate 108 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The target substrate 108 has a photosensitive layer formed thereon.

The wafer stage 112 may be operable to move the substrate 108 in a plurality of directions including linearly (laterally and diagonally) and/or rotary-fashion. The movements of the substrate 108 may provide a scan direction (e.g., a movement of an incident beam on the target substrate).

The electron gun 102 provides a source of electrons in one or more beams. The source of electrons may include $LaB_6$, $W/ZrO_2$, and/or other sources. The projection optics system 106 may include a plurality of lens. The lens may include, for example, electrostatic and magnetic lenses such as, transfer lens, demagnification lens, cathode lens, magnification lens, condenser lens, and/or other suitable lens. The projection optics system 106 may also include a magnetic prism and/or other suitable functionality. In an embodiment, approximately 5× magnification of the beam from the gun 102 to the DPG 104 is provided. In an embodiment, approximately 50× in demagnification is provided from the DPG 104 to the substrate 108. The projection optics 106 may include a filter (e.g., Wien Filter) consisting of crossed electrostatic and magnetic deflection fields suitable for separating the projection beam from the illumination beam.

Data 110 is provided to the DPG 104 to determine the generated pattern to be provided by the beam, and subsequently formed onto the substrate 108. The data 110 may represent a semiconductor device such as an integrated circuit (IC) device. The IC may include a device such as a static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The data 110 may be an IC database file such as a layout file. The data 110 may be IC data generated as a computer file, for example, as a graphic database system (GDS) type file, as an open artwork system interchange standard (OASIS) type file, and/or as any appropriate type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools including the system 100.

The DPG 104 includes a CMOS-based device or chip with multiple pixels, each pixel being independently operable to be "on" or "off". The multiple pixels are arranged in an array. Each pixel includes an electron mirror. Thus, the pixels act as a mirror array. For example, when a pixel is in an "on" state, the e-beam can be directed through the pixel also referred to as absorbed. When the pixel is in an "off" state, the e-beam may be blocked from going through the pixel, also referred to as reflected. During the lithography process, the e-beam is directed to the pattern generator, the pattern generator is controlled to independently turn on or off each pixel by a control circuit coupled with each pixel and addressing each pixel. The controlled pixel status is determined by the data 110. The pixel may be turned off/on by sending "data" to the pixel for example, applying a voltage potential to the pixel (e.g., 2V). A DPG is described in further reference with respect to FIGS. 2-3.

The system 100 may use the DPG 104, which has binary (on/off) pixels, to provide a gray tone exposure to provide a pattern on the substrate 108. For example, as the substrate 108 moves under the beam, the pattern of pixels on the DPG 104 shifts so that the electrons reflected from successive pixels of a row on the DPG can be incident the same spot on the wafer. In an embodiment, the mirror array of the DPG 104 is a large array of bi-directional shift registers interconnected to serve as a programmable gray-scale raster image.

One reflective electron beam lithography tool, such as the system 100, is described in further detail in *REBL Nanowriter: Reflective Electron Beam Lithography*, by Petric et al., Proc. of SPIE Vol. 7271, which is hereby incorporated by reference in its entirety. In an embodiment, the system 100 is a REBL system.

Figure 2:
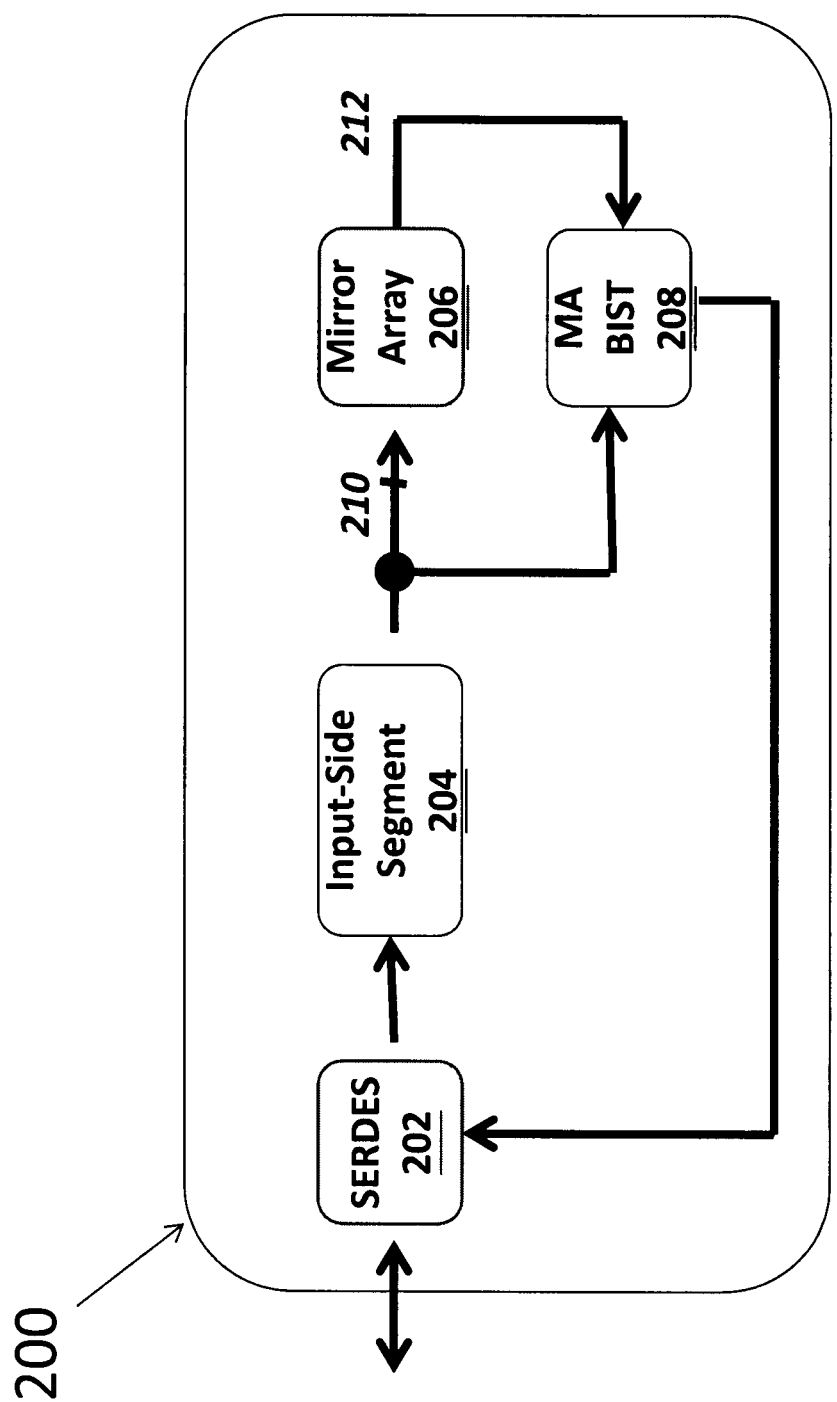
FIG. 2 is an embodiment of a block diagram of an embodiment of a digital pattern generator (DPG) system according to one or more aspects of the present disclosure.

Referring now to FIG. 2, illustrated is a DPG 200. In an embodiment, the DPG 200 may be used as the DPG of the system 100, described above with reference to FIG. 1. The DPG 200 may be formed on a semiconductor device such as a CMOS-chip. The DPG 200 includes control circuitry such as a serializer/de-serializer (SERDES) 202 and an input-side segment 204. The DPG 200 further includes a mirror array 206 and a mirror array built-in-self-test (BIST) 208. Conductive connections (e.g., traces) are provided to the mirror array 206 illustrated as data lines 210 and a conductive connection is provided for output of the mirror array 206, illustrated as data line 212.

The Serializer/Deserializer 202 may include a pair of functional blocks suitable for use in high speed communications to compensate for otherwise limited input/output structures. These blocks convert data between serial data and parallel interfaces in each direction. The SERDES 202 provides an interface for data (e.g., design data) into/out from the DPG 200 in an e-beam lithography system such as, for example, the system 100 described above with reference to FIG. 1.

The BIST 208 is provided to gain real time verification to ensure the operating correctness of the DPG 200.

The mirror array 206 includes a plurality of pattern generation elements referred to herein as pixels or mirrors. Each pixel is independently operable to be "on" or "off". The pixels are arranged in an array and thus, referred to as a mirror array. The array may include several sub-arrays with control circuitry associated therewith. When a pixel is in an "on" state, the e-beam can be directed through the pixel, also referred to as the beam being absorbed. When the pixel is in an "off" state, the e-beam may be blocked from going through the pixel, also referred to as a reflected beam. The controlled pixel status is determined by the data provided to the DPG 200 (e.g., defined by the layout). Specifically, each of the pixels comprises a conductive surface configured such that a voltage applied to the pixel controls a pattern of a resultant beam. The pixel may be turned off/on by sending "data" to the pixel for example, applying a voltage potential to the pixel (e.g., 2V).

In a conventional embodiment, N parts of data are sent into the mirror array (one set for each bank) and N parts of data (one set for each bank) are also provided out of the mirror array. Thus, N routing signals would be used as inputs to the mirror array and N routing signals are provided from the mirror array, for example, to a BIST for verification. Such an embodiment may be disadvantageous in the real estate of the DPG required for the routing signals. Additionally, a BIST must include hardware for comparing each of N input and N output parts of data (e.g., bits).

In the present embodiment, the data lines 210 provide N parts of input to the mirror array 206. Each of the N parts is associated with a different bank of the mirror array. Thus, in an embodiment, there are N separate routing signals (or conductive traces). However, the data lines 212 output from the mirror array 206 may be less than N. For example, in an embodiment, a single one routing signal (e.g., a single trace) providing a part of data (e.g., bit) at a given time is output from the mirror array 206, as discussed in further detail below with reference to FIG. 3.

In an embodiment, the data from the N separate data lines 210 are provided to the BIST 208. In an embodiment, the data from the output data line 212 is also provided to the BIST 208. As discussed above, in an embodiment, the output data line 212 is a single routing signal line. The BIST 208 compares the data on the signal lines 210 with that on the signal line 212. In a further embodiment, the data line 212 may provide a single bit of data at any given time. Thus, in an embodiment, the BIST 208 compares a single bit of output data with that of the input data. The BIST 208 may include a shift register to compare the bit (or bits) of data. The comparison may indicate if the accuracy of the programming of the mirror array 206.

Figure 3:
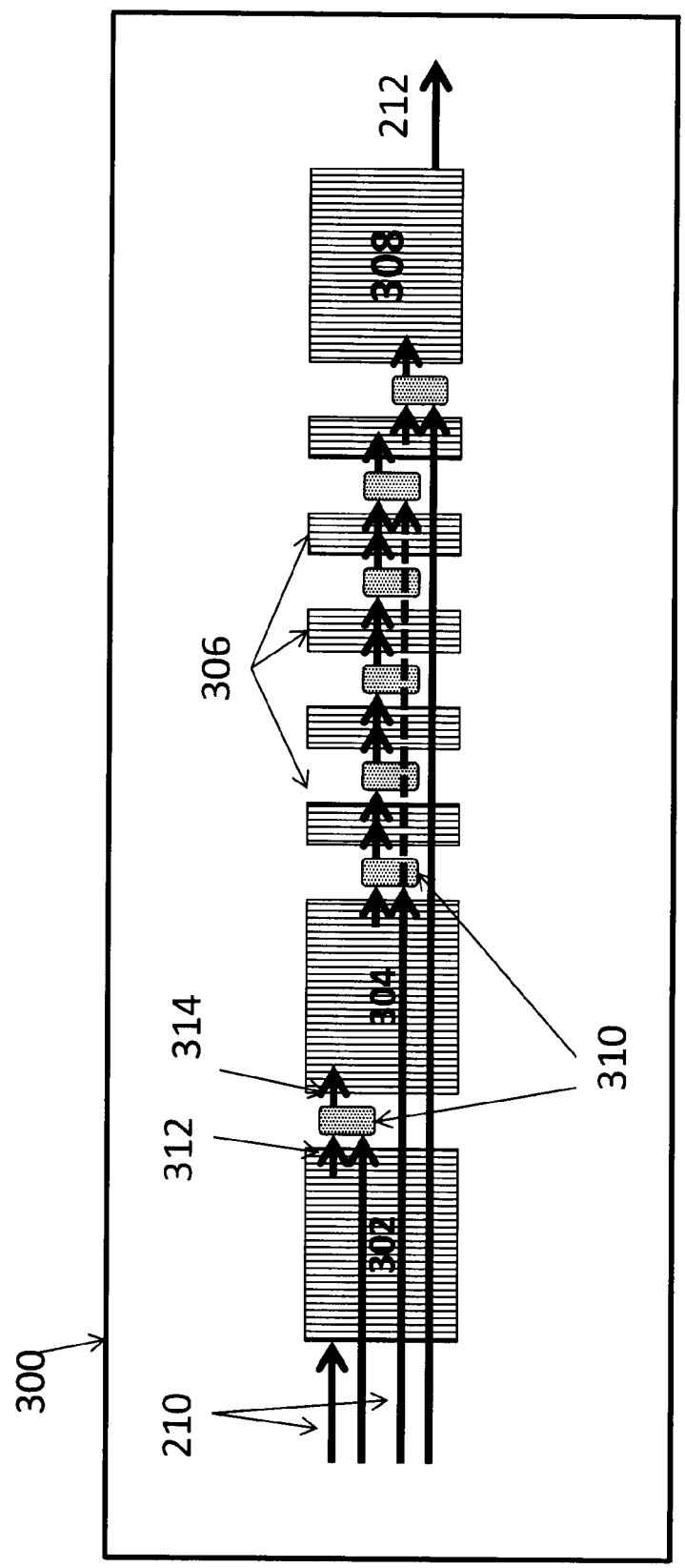
FIG. 3 is an embodiment of a block diagram of a mirror array system according to one or more aspects of the present disclosure.

Referring now to FIG. 3, illustrated is an embodiment of a pattern generation elements (also referred to as a pixel array or mirror array) 300 that may be used in a DPG of lithography tool such as the mirror array 206 of the DPG 200 in FIG. 2 and/or in the DPG 104 of the lithography system 100 of FIG. 1. The mirror array 300 may be referred to as a chain (e.g., single chain) mirror array. The mirror array 300 includes a plurality of banks of pixels or mirrors; the pixels in each bank may each be arranged as an array. The banks are denoted 302, 304, 306, and 308 in FIG. 3. Bank 302 is a first, or initial, bank of the chain. Bank 308 is the last or terminal bank of the chain. However, it is noted that any number of banks may be provided and any number of pixels may be included in each bank. The banks 302, 304, 306, and 308 are connected serially.

Combinational logic 310 interposes each of the banks of the pixel array 300. Each combinational logic 310 block may be a logic structure such as a digital logic gate. Exemplary combinational logic 310 includes structures such as, for example, an XOR structure, an XNOR structure, a MUX structure, and/or other suitable structure. The combinational logic 310 may be separate from and spaced a distance from the bank of mirror arrays. For example, the combinational logic 310 may be separate and spaced a distance from any control logic or interface for the array (e.g., row/column selection structures).

As illustrated in FIG. 3, the plurality of banks 302, 304, 306, and 308 are linked (e.g., by signal lines) into one chain. An input line 210 is provided directly to the first bank 302. Thus, design data is input directly into the first bank 302.

However, for subsequent banks in the chain, the arrangement may be modified. For example, the input of the second bank 304, its input line 210, is connected first to the combinational logic block 310 that precedes bank 304 in the chain. Also input to the combinational logic 310 that precedes the second bank 304 is the data from the preceding block 302, illustrated as input 312. The data on the input line 210 directed to the second bank 304 is used to change the data output from bank 302 on line 312. The data is then propagated to the second bank 304, as illustrated by line 314. Thus, the combinational logic 310 receives, acts upon, and changes the data, and then propagates the data on the respective signal line into the next bank.

This continues for the remainder of the chain. For example, the input of the third bank 306, its input line 210, is connected first to the combinational logic block 310 that precedes bank 306 in the chain. Also input to the combinational logic 310 that precedes the third bank 306 is the data from the preceding block 304, illustrated as input 312. The data on the input line 210 directed to the third bank 306 is used to change the data output from bank 304 on line 312. The data is then propagated to the third bank 306, as illustrated by line 314. Thus, the combinational logic 310 changes and propagates the data on the respective signal line into the next bank. This continues through the chain to the final block, illustrated as block 308. In doing so, each block serves as a shift register. In an embodiment, the block serves to shift the data using a clock signal where the data is shifted with respect to the clock signal.

FIG. 3 illustrates that a single output line 212 is provided from the array 300. The output line 212 is output from the terminal bank in the chain, bank 308. The output line 212 may be provided to a BIST structure, such as the BIST 208 of FIG. 2. The data on each input line 210 may also be provided to the BIST structure, see FIG. 2. Thus, the data integrity of the data on lines 210 and/or 212 may be checked or verified by a BIST coupled to the array 300 by comparing a final, single data output from the array.

Thus, it is noted that the array 300 of FIG. 3 includes N inputs, where N is equal to the number of banks. The array 300 further includes a single one output. Thus, the routing signals may be reduced from a configuration having an output from each bank being sent to a BIST structure.

Figure 4:
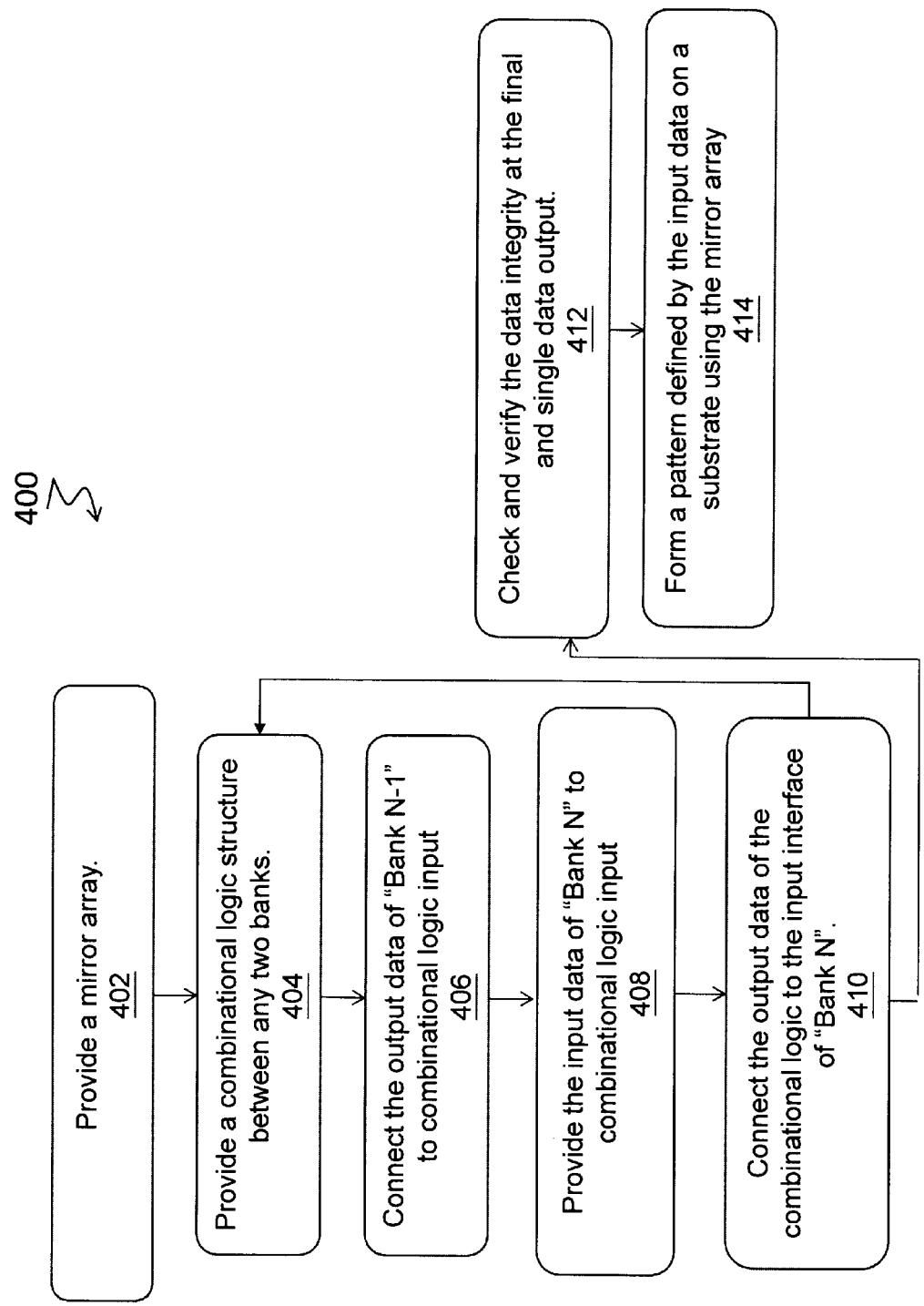
FIG. 4 is an embodiment of a flow chart of a method of operating a mirror array including a verification step according to one or more aspects of the present disclosure.

Referring now to FIG. 4, illustrated is a method 400 for providing a mirror array of a DPG including a verification step. The method 400 may be used to provide and/or operate the system 100 of FIG. 1, the DPG 200 of FIG. 2 and/or the mirror array 300 of FIG. 3. The method 400 begins at step 402 where a mirror array is provided. The mirror array may be substantially similar to the mirror array 300 discussed above with reference to FIG. 3. The mirror array may include a plurality of banks; any number of banks is possible and within the scope of the present disclosure. The banks may be shift register banks. In the exemplary embodiment, the banks include a first bank denoted N−1 and a subsequent bank denoted N. The banks may be disposed serially in a chain.

The method 400 then proceeds to block 404 where a combinational logic structure such as, for example, an XOR, a XNOR, or a MUX, is provided between each of the banks. In an embodiment, the combinational logic is provided between bank N−1 and bank N. The combinational logic structure may be substantially similar to the combinational logic structure 310 discussed above with reference to FIG. 3. A single combinational logic structure may be provided between banks.

The method 400 then proceeds to block 406 where the output of a preceding bank, e.g., bank N−1, is connected to and provided to the combinational logic structure. The connection may be provided by a conductive trace or interconnect structure. The connection may be a conductive structure (e.g., lines and/or vias) formed on a substrate such as a semiconductor substrate that also includes the mirror array elements. The output routing of the bank N−1 may be substantially similar to element 312 of FIG. 3, discussed above. The output from the bank may be "data," including, for example, a defined voltage potential implemented by a pixel of the bank. The data may be defined by the design data (e.g., layout) of a semiconductor device to be patterned using the mirror array.

The method 400 then proceeds to block 408 where the input to the subsequent bank, bank N, is provided to the combinational logic structure. The input may be data defined by a design to be imaged by the mirror array. The input "data" may include, for example, a defined voltage potential to be implemented by a pixel of the bank. The data may be defined by the design data (e.g., layout) of a semiconductor device to be patterned using the mirror array. In an embodiment, the data input defines the reflectivity of the mirrors of the bank N of the mirror array. The input routing to the combinational logic structure may be substantially similar to element 210 of FIGS. 2 and/or 3.

The method 400 then proceeds to block 410 where the output of the combinational logic, discussed above, is connected to the input of the next bank (e.g., bank N). The connection may be provided by a conductive trace or interconnect structure. The connection may be a conductive structure (e.g., lines and/or vias) formed on a substrate such as a semiconductor substrate that also includes the mirror array elements. The output routing of the combinational logic may be substantially similar to element 314 of FIG. 3, discussed above. The output from the combinational logic may be "data," including, for example, defining a voltage sent to a pixel of the bank. The data may be defined by the design data (e.g., layout) of a semiconductor device to be patterned using the mirror array.

The method 400 may continue to repeat steps 404 to 410 for any number of banks that are provided in the mirror array. After the data is passed through each bank of the mirror array, the single data line is output from the array (e.g., the output of the last bank in the array). The method then proceeds to block 412 where the data integrity at the output is verified. Specifically, the data on the output line of the last bank in the mirror array is checked and/or verified for its integrity. The output data verified may be provided on a single line such as, for example, described above with reference to element 212 of FIGS. 2 and/or 3. In an embodiment, the data is checked and/or verified using the input data defined for one or more, or all, banks of the mirror array. The verification may be performed using a BIST structure or other structure known in the art.

The method 400 proceeds to block 414 where a pattern is formed on a substrate using the input data to the mirror array. It is noted that block 414 may be performed simultaneously with one or more of the blocks of the method 400. The input data provided to the mirror array may define each mirror (or pixel) of the array to be "on" or "off". For example, when a pixel is in an "on" state as defined by the input data, the e-beam can be directed through the pixel also referred to as absorbed. When the pixel is in an "off" state as defined by the given data, the e-beam may be blocked from going through the pixel, also referred to as reflected. Thus, the beam is patterned. The patterned beam is then delivered to a substrate such as a semiconductor substrate having a layer formed thereon. In an embodiment, the layer is a photosensitive layer such as photoresist or simply, resist. The pattern beam exposes the resist thereby altering its solubility to a developer, thus patterning the resist.

The method 400 may be repeated any number of times as data defining a pattern is provided to the mirror array. In an embodiment, the method 400 provides for substantial real-time verification of the operation of the mirror array as the output data is verified after it passes through the final mirror array bank. New input data may be continuously supplied to the mirror array.

Figure 5:
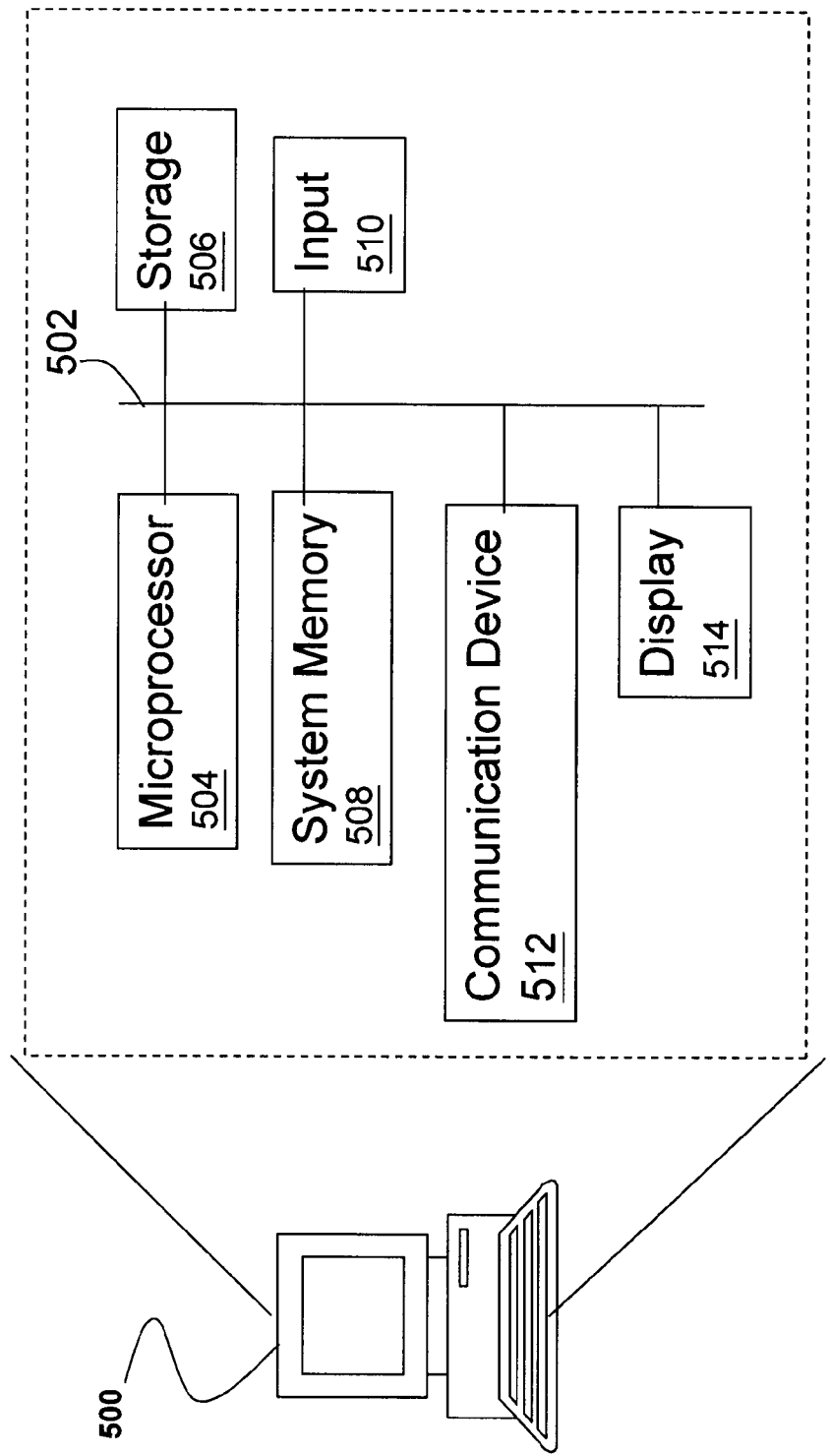
FIG. 5 is an embodiment of an information handling system operable to perform one or more aspects of the systems of FIGS. 1-3 and/or the method of FIG. 4.

One system for providing the disclosed embodiments of portions of the systems of FIGS. 1-3 and/or the method of FIG. 4 is illustrated in FIG. 5. Illustrated is an embodiment of an information handling system 500 for implementing embodiments of the present disclosure including the systems and methods described herein. In an embodiment, the computer system 500 includes functionality providing for one or more steps of the method of design including transmitting design data to a DPG as described above.

The information handling system 500 includes a microprocessor 504, an input device 510, a storage device 506, a system memory 508, a display 514, and a communication device 512 all interconnected by one or more buses 502. The storage device 506 may be a floppy drive, hard drive, CD-ROM, optical device or any other storage device. In addition, the storage device 506 may be capable of receiving a floppy disk, CD-ROM, DVD-ROM, or any other form of computer-readable medium that may contain computer-executable instructions. The communications device 512 may be a modem, a network card, or any other device to enable the computer system to communicate with other nodes. It is understood that any computer system 500 could represent a plurality of interconnected computer systems such as, personal computers, mainframes, smartphones, and/or other telephonic devices.

The computer system 500 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise an information handling system. The system memory 508 may be configured to store a design database, algorithms, images, graphs, and/or other information.

Computer readable medium includes non-transitory medium. Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 500 may be used to implement one or more of the methods and/or devices described herein. In particular, the computer system 500 may be operable to generate, store, manipulate, analyze, and/or perform other actions on data associated with an e-beam lithography tool. For example, in an embodiment, one or more of the design data described above may be generated, manipulated, and/or stored using the computer system 500.

In summary, the methods and systems disclosed herein provide for providing a digital pattern generator (DPG) for an electron-reflective beam device used in a lithography process. The DPG controls whether an e-beam of the lithography process writes to the target substrate or not. The mirror array is a large array of bi-directional shift registers that may be connected as a series of banks. As these mirror arrays get smaller in size to achieve nanometer scale manufacturing, verifying data and providing suitable routing between banks becomes more difficult. Thus, the systems and methods provide embodiments discussed herein that provide for a single output line from a series of banks. The verification may be performed on this single output line. Thus, the verification may be improved in speed and/or efficiency. It is understood that different embodiments disclosed herein offer different disclosure, and that they may make various changes, substitutions and alterations herein without departing from the spirit and scope of the present disclosure.

Thus, it will be appreciated that in one of the broader embodiments discussed herein, provided is a system for electron-beam lithography. The system includes a digital pattern generator (DPG) having a mirror array. The mirror array includes a first bank of mirrors and a second bank of mirrors. A combinational logic structure interposes the first and second banks of mirrors. A first output data line extends from the first bank of mirrors to the combinational logic structure. An input data line that carries data associated with the second bank of mirrors is also provided to the combinational logic structure. A second output data line extends from the combinational logic structure to second data bank.

In a further embodiment, the combinational logic structure of the mirror array is one of a XOR, XNOR, and a multiplexor (MUX). In one embodiment, a third output data line extends from the second bank of mirrors and is coupled to a built-in-self-test (BIST) structure (of the DPG). The BIST structure may be operable to compare data on the third output data line with data on the input data line. (Data for example is a voltage to be provided to a pixel of the mirror array). For example, the input data line for the second bank of mirrors may carry data defining a reflectivity of mirrors of the second bank of mirrors.

In a further embodiment, a second input line is provided directly to the first bank of mirrors (e.g., as opposed to combinational logic structure). In embodiments, the system further includes a third bank of mirrors disposed such that the first bank of mirrors interposes the third bank of mirrors and the second bank of mirrors. A second combinational structure may interpose the third bank and the first bank. In such an embodiment, a third output data line may extend from the third bank of mirrors to the second combinational structure while a second input data line is directly coupled to the third bank of mirrors. Further, a fourth data output line may be provided from the second combination structure to the first bank of mirrors.

In an embodiment, the e-beam lithography system also includes an electron source operable to provide a beam incident the mirror array and a substrate stage operable to hold a substrate for receiving the beam after reflection from the mirror array.

In another of the broader embodiments, a system is provided that includes providing a plurality of mirror array banks disposed in a chain. The plurality of mirror array banks includes a first mirror array bank at one end of the chain and a terminal mirror array bank at an opposing end of the chain. Combinational logic structures interpose each of the plurality of mirror array banks in the chain. A first input line is provided to the first mirror array bank. A plurality of additional input lines are also provided, each additional input line provided to one of the combinational logic structures. A single output line extends from the terminal mirror array bank. Finally, a plurality of additional output lines are provided one extending from the first mirror array bank to the adjacent combinational logic structure and one extending from each subsequent mirror array bank to the adjacent combinational logic structure.

In a further embodiment, the system includes a built-in-self test (BIST) structure coupled to the mirror array. The single output line may be directly connected to the BIST structure. Additionally, each of the plurality of additional input lines may also be provided to the BIST structure. In an embodiment, the number of data signals coupled to the mirror array in the system is equal to a number of banks of the mirror array plus one (1). For example, with N banks, the data signals would number N+1. The data signals in this count include the first input line, the plurality of additional input lines, and the single output line.

In another of the broader embodiments, a method of performing a verification of data in a digital pattern generator is discussed. The method includes providing a plurality of input data lines to a built-in-self-test (BIST) structure. Data is provided on each of the plurality of input data lines. The data is associated with a plurality of different banks of a mirror array. A single output data line is provided to the BIST structure. The BIST can be used to verify an output data bit on the single output data line using input data on the input data lines.

In a further embodiment of the method, the single output data line conveys data from a terminal bank of a chain of banks of the mirror array. The method may include providing the plurality of input data lines to a mirror array, for example, where each data line has data for a given bank of the array. The mirror array is used to pattern a beam as defined by the data on each of the plurality of input data lines. The patterned beam may be used to pattern a layer disposed on a semiconductor substrate.

What is claimed is:

1. An electron-beam lithography system, comprising:
    a digital pattern generator (DPG) having a mirror array, wherein the mirror array includes: a first bank of mirrors and a second bank of mirrors;
    a combinational logic structure interposing the first and second banks of mirrors;
    a first output data line from the first bank of mirrors to the combinational logic structure;
    an input data line provided to the combinational logic structure, wherein the input data line carries data associated with the second bank of mirrors; and
    a second output data line from the combinational logic structure to second data bank.

2. The system of claim 1, wherein the combinational logic structure is one of a XOR, XNOR, and a multiplexor (MUX).

3. The system of claim 1, wherein the DPG further comprises: a third output data line from the second bank of mirrors coupled to a built-in-self-test (BIST) structure.

4. The system of claim 3, wherein the BIST structure is operable to compare data on the third output data line with data on the input data line.

5. The system of claim 1, further comprising: an electron source operable to provide a beam incident the mirror array; and a substrate stage operable to hold a substrate for receiving the beam after reflection from the mirror array.

6. The system of claim 1, wherein the input data line for the second bank of mirrors carries data defining a reflectivity of mirrors of the second bank of mirrors.

7. The system of claim 1, further comprising: a second input line provided directly to the first bank of mirrors.

8. The system of claim 1, further comprising: a third bank of mirrors disposed such that the first bank of mirrors interposes the third bank of mirrors and the second bank of mirrors; and a second combinational structure interposing the third bank and the first bank.

9. The system of claim 8, further comprising: a third output data line from the third bank of mirrors to the second combinational structure; and a second input data line directly coupled to the third bank of mirrors.

10. The system of claim 9, further comprising: a fourth data output line from the second combination structure to the first bank of mirrors.

11. A system, comprising:
    a plurality of mirror array banks disposed in a chain, wherein the plurality of mirror array banks has a first mirror array bank at one end and a terminal mirror array bank at an opposing end of the chain;
    a combinational logic structure interposing each of the plurality of mirror array banks;
    a first input line provided to the first mirror array bank;
    a plurality of additional input lines, each additional input line provided to one of the combinational logic structures;
    a single output line extending from the terminal mirror array bank; and a plurality of additional output lines one extending from the first mirror array bank to the adjacent combinational logic structure and one extending from each subsequent mirror array bank prior to the terminal mirror array bank to its adjacent combinational logic structure.

12. The system of claim 11, further comprising: a built-in-self test (BIST) structure coupled to the mirror array.

13. The system of claim 12, wherein the single output line is directly connected to the BIST structure.

14. The system of claim 13, wherein each of the plurality of additional input lines is also provided to the BIST structure.

15. The system of claim 11, wherein a number of data signals coupled to the mirror array is equal to a number of banks of the mirror array plus one, wherein the data signals includes the first input line, the plurality of additional input lines, and the single output line.

16. An electron-beam lithography system, comprising:
a first bank of mirrors and a second bank of mirrors;
a combinational logic structure interposing the first and second banks of mirrors, wherein the combinational logic structure is one of a XOR, XNOR, and a multiplexor (MUX);
a first output data line from the first bank of mirrors to the combinational logic structure;
an input data line provided to the combinational logic structure, wherein the input data line carries data associated with the second bank of mirrors; and
a second output data line from the combinational logic structure to second data bank.

17. The system of claim 16, wherein the DPG further comprises:
a third output data line from the second bank of mirrors coupled to a built-in-self-test (BIST) structure operable to compare data on the third output data line with data on the input data line.

18. The system of claim 16, further comprising:
an electron source operable to provide a beam incident at least one of the two banks of mirrors; and
a substrate stage operable to hold a substrate for receiving the beam after reflection from the bank(s) of mirrors.

19. The system of claim 16, wherein the input data line for the second bank of mirrors carries data defining a reflectivity of mirrors of the second bank of mirrors.

20. The system of claim 16, further comprising:
a third bank of mirrors disposed such that the first bank of mirrors interposes the third bank of mirrors and the second bank of mirrors;
a second combinational logic structure interposing the third bank and the first bank;
a third output data line from the third bank of mirrors to the second combinational logic structure; and a
second input data line directly coupled to the third bank of mirrors.

* * * * *